(12) United States Patent
Neuilly et al.

(10) Patent No.: US 7,786,014 B2
(45) Date of Patent: Aug. 31, 2010

(54) ELECTRONIC DEVICE AND METHOD FOR MAKING THE SAME

(75) Inventors: Francois Neuilly, Colomby-sur-Thaon (FR); David D. R. Chevrie, Bretteville sur Odon (FR); Dominique Yon, Saint Aubin sur Mer (FR)

(73) Assignee: IPDIA, Caen (FR)

( * ) Notice: Subject to any disclaimer, the term of this patent is extended or adjusted under 35 U.S.C. 154(b) by 0 days.

(21) Appl. No.: 12/442,351

(22) PCT Filed: Sep. 14, 2007

(86) PCT No.: PCT/IB2007/053719

§ 371 (c)(1),
(2), (4) Date: Mar. 20, 2009

(87) PCT Pub. No.: WO2008/035261

PCT Pub. Date: Mar. 27, 2008

(65) Prior Publication Data

US 2009/0269931 A1 Oct. 29, 2009

(30) Foreign Application Priority Data

Sep. 22, 2006 (EP) .................................. 06300976

(51) Int. Cl.
*H01L 21/311* (2006.01)
(52) U.S. Cl. ................................ 438/700; 257/E21.249
(58) Field of Classification Search ................. 438/700; 257/E21.249
See application file for complete search history.

(56) References Cited

U.S. PATENT DOCUMENTS

| 4,961,821 | A | 10/1990 | Drake et al. | |
| 6,036,872 | A * | 3/2000 | Wood et al. | 216/2 |
| 6,110,843 | A | 8/2000 | Chien et al. | |
| 6,294,476 | B1 | 9/2001 | Lin et al. | |
| 6,352,923 | B1 | 3/2002 | Hsuan et al. | |
| 6,577,427 | B1 * | 6/2003 | Gee et al. | 359/224.1 |
| 6,756,304 | B1 | 6/2004 | Robert | |
| 7,053,456 | B2 * | 5/2006 | Matsuo | 257/415 |
| 7,482,194 | B2 * | 1/2009 | Matsuo | 438/52 |

(Continued)

FOREIGN PATENT DOCUMENTS

EP 1195808 A 4/2002

(Continued)

*Primary Examiner*—Charles D Garber
*Assistant Examiner*—Stanetta D Isaac
(74) *Attorney, Agent, or Firm*—Hamre, Schumann, Mueller & Larson, P.C.

(57) ABSTRACT

The present invention provides a method for making a vertical interconnect through a substrate. The method makes use of a sacrificial buried layer 220 arranged in between the first side 202 and the second side 204 of a substrate 200. After having etched trenches 206 and 206' from the first side, the sacrificial buried layer 220 functions as a stop layer during etching of holes 218 and 218' from the second side, therewith protecting the trenches from damage during overetch of the holes. The etching of trenches is completely decoupled from etching of the holes providing several advantages for process choice and device manufacture. After removing part of the sacrificial buried layer to interconnect the trenches and the holes, the resulting vertical interconnect hole is filled to form a vertical interconnect.

17 Claims, 7 Drawing Sheets

U.S. PATENT DOCUMENTS

| | | |
|---|---|---|
| 2004/0061238 A1 | 4/2004 | Sekine |
| 2004/0102035 A1 | 5/2004 | Lee |
| 2005/0059204 A1 | 3/2005 | Heschel |
| 2005/0088699 A1 | 4/2005 | Silverbrook |

FOREIGN PATENT DOCUMENTS

| | | |
|---|---|---|
| EP | 1564805 A1 | 8/2005 |
| EP | 1672687 A1 | 6/2006 |
| WO | 2005099699 A1 | 10/2005 |

* cited by examiner

ELECTRONIC DEVICE AND METHOD FOR MAKING THE SAME

FIELD OF THE INVENTION

The invention relates to a method for manufacturing an electronic device comprising a vertical interconnect through a semiconductor substrate having a first surface on a first side and a second surface on a second side, the vertical interconnect extending from the first surface to the second surface.

The invention also relates to an electronic device prepared according to the method.

BACKGROUND OF THE INVENTION

A method to make vertical interconnects in a semiconductor substrate is known from WO 2005/099699 A1. In the method trenches are formed in the semiconductor substrate by etching from the first side of the substrate and a cavity is formed by etching from the second side of the substrate in such a way that the trenches and the cavity together form vertical interconnect hole through the substrate. The vertical interconnect hole is given a conductive surface so as to form the vertical interconnect extending from the first surface to the second surface of the semiconductor substrate.

The prior art method uses a two-step etching process to obtain a vertical interconnect hole comprising two parts that are complementary, the first part comprising one or more trenches and the second part comprising a cavity. This method allows that the resolution of the vertical interconnect hole, at least at first side of the semiconductor substrate can be increased independently from that of the dimension on the second side.

SUMMARY OF THE INVENTION

In one aspect the invention provides a method of the kind specified in the prior art which allows manufacture of vertical interconnects having improved electrical properties.

The invention is defined by the independent claims. The dependent claims define advantageous embodiments.

The object is achieved in that the method comprises the steps of:

providing the substrate with a sacrificial buried layer arranged in between the first and second surface;

providing the substrate with a trench extending from the first surface to the sacrificial buried layer by removing material from the first side of the substrate, the sacrificial buried layer therewith being exposed over a first area, the sacrificial buried layer having a first cross section taken parallel to the plane of the first area which first cross section is larger than the first area and overlaps with the first area, and providing the substrate with a hole extending from the second surface to the sacrificial buried layer by removing material from the second side of the substrate selectively with respect to the sacrificial buried layer, the sacrificial buried layer therewith being exposed over a second area, the sacrificial buried layer having a second cross section taken parallel to the plane of the second area which second cross section is larger than and overlaps with the second area, and the second area being smaller than the first area.

The present invention is based on the following insights. The electrical resistance of the vertical interconnect is determined by its part having the smallest width, i.e. cross section taken perpendicular to the direction of current through the vertical interconnect. In the present invention as well as the prior art referred to here above, the trench has the smallest width which is well controlled by the etch mask dimension. Hence, in order to obtain a vertical interconnect having well defined electrical resistance, the depth of the trench of a vertical interconnect must be controlled accurately. When multiple vertical interconnects are required that are disposed over a large substrate surface area, this depth control must be uniform over the appropriate substrate area. Furthermore, the spatial depth control must be obtained without having to use complicated and expensive trench etching procedures. In WO 2005/099699 A1 the trench depth is dependent on both etch steps used in the method disclosed, i.e. the trench depth is determined by the etch depth of the cavity regardless of whether the trench is etched before or after the cavity. In the present invention, the sacrificial buried layer present within the substrate at a predefined distance from the first surface of the substrate removes this dependency. This is brought about by the use of the sacrificial buried layer as an etch stop layer. More specifically, its presence allows to etch the trenches from the first side in the substrate with a constant depth determined by the distance between the first surface and the nearest surface of the buried sacrificial layer. In addition, the buried sacrificial layer and the trench are provided to the substrate in such a way that the trench is narrower than the sacrificial buried layer, i.e. the sacrificial buried layer has a larger cross section than its area exposed by the bottom of the trench. Therewith, the sacrificial burred layer shields the trench during etching of the hole from the second side, such that the trench depth will not be affected in the process.

Thus, the two etching steps of the method of the present invention are decoupled from each other very effectively. This provides increased freedom of choice for the dimensions of trench and hole as well as the processes used for creating the trench and hole. Also, processes for creating the trench and/or hole will be less critical as will be elucidated in the detailed description of the embodiments of this application. This is an advantage with respect to the ever increasing substrate size in for example semiconductor industry.

A further advantage of the method is that the sacrificial buried layer can be used as a sealing layer closing the vertical interconnect hole when the trench and cavity have been opened. Sealing may be advantageous when processing on both sides of the substrate is performed while the trench and hole of a future vertical interconnect have already been opened, since then contamination of one side or damage to substrate holders of processing tools through the vertical interconnect hole is prevented during processing on the other side. Furthermore, some tools make use of vacuum for holding the substrate on their holders, which is not possible if holes are opened in the substrate.

In an embodiment the step of providing the substrate with a buried sacrificial layer comprises:

providing a substrate without the buried sacrificial layer, providing the trench before performing the step for providing the hole, the step of providing the trench including anisotropic removal of material from the first side of the substrate such that the trench is formed having a bottom with a bottom area located within the semiconductor substrate in between the first and second surface, and after providing of the trench and before providing the hole, performing the step of providing the sacrificial buried layer such that it is provided in between the first and second surfaces of the semiconductor substrate by forming a cavity at the bottom of the trench, the cavity having a cross section parallel to the plane of the bottom of the trench, which cross section is larger than the area of the bottom of the trench, and filling at least part of the cavity with a sacrificial material.

In this embodiment the substrate need not have an initially built in buried sacrificial layer to achieve the effect of the invention. Hence, single material substrates can be used or substrates having buried layers that do not initially support selective removal of material to form the trench according to the invention. The advantage is obtained due to the following. The trench etch generally is a delicate etch due to the small lateral dimensions of the trench. Hence it can be accurately controlled with respect to etch depth. Therefore according to the method of the present embodiment first a trench is formed. Subsequently, this trench is protected against over etching during formation of the hole from the second side by formation of a buried sacrificial layer according to the invention. This is done by first etching a cavity beneath the trench and provide this cavity with a suitable temporary filling that at least allows selective etching of the hole.

In a variation of the previous embodiment the cavity is provided using an isotropic dry etch technique.

Wet isotropic etching of the cavity is possible, but may be difficult due to the fact that the etching fluid can only reach the cavity via the trench. Hence, the trench itself may be etched by the etching fluid and/or it may be difficult to insert and/or remove the etching fluid from the cavity and the trench due to capillary forces. Such disadvantages can be circumvented by using a dry etch technique for opening the cavity.

In an embodiment the method comprises the further steps of:

providing the trench with a temporary filling extending up to at least the first surface before continuing processing to further build the electronic device;

after the continued processing removing the sacrificial buried layer and the temporary filling from the second side therewith opening a vertical interconnect hole.

The sacrificial buried layer makes it possible to providing the trench with a temporary filling after the hole has been formed. In turn the first filling renders the first surface on the first side of the substrate relatively level. Therewith, at least the substrates first surface may be conveniently provided with all sorts of layers and materials that form the elements of the electronic. In addition, the temporary filling protects the trench during this continued processing.

The sacrificial burred layer and if necessary the temporary filling can be conveniently removed from the second side through the hole in order to open the vertical interconnect hole. Note that the temporary filling may be the desired final vertical interconnect material such as a metal. In that case it does not need to be removed. This embodiment provides a simple method to open the vertical interconnect hole from the second side after substantially finishing the electronic device.

In an embodiment the temporary filling of the trench is chosen from a group of materials that does not contaminate semiconductor processing tools. In semiconductor processing it is common knowledge that certain materials such as for example a number of metals, have a contaminating effect when processing semiconductors. Thus, after having provided such materials to a substrate the substrate is not allowed to re-enter a semiconductor processing tool, such as for example a dry etching tool. Therefore, it is advantageous that materials for the temporary filling are chosen such that they do not belong to the group of contaminating materials, since in that case the substrate including the temporary filling may be reintroduced into semiconductor processing tools such as for example a tool for doping semiconductors, a deposition tool such as physical vapor deposition, chemical vapor deposition or the like, an etching tool such as a dry etching tool all used during continued processing and/or etching of the hole from the second side. Dry etching allows directional etching and better control over the shape of the hole in comparison to wet etching which would be the alternative.

In an embodiment the method comprises the further steps of:

providing the trench with a temporary filling extending up to at least the first surface, providing on the first side of the substrate a temporary cover layer covering at least the temporary filling.

after providing the temporary cover layer, removing the sacrificial buried layer and the temporary filling from the second side therewith exposing the temporary cover layer from the second side.

The method of this embodiment has the advantage that after providing of the temporary cover layer etching for opening of the vertical interconnect hole is performed before any materials including the here before mentioned contaminating materials are provided to the substrate that would contaminate the tools used for the etching process. Thus the dry etching tool may be used to create all cavities, trenches and/or holes and to open the entire vertical interconnect hole while the interconnect hole is at the same time sealed on the first side by the temporary cover layer. Therewith the method allows cheaper and better controlled etching when compared to the use of wet etching. Furthermore, once the vertical interconnect hole has been opened, the temporary cover layer protects the vertical interconnect hole and the second side of the substrate, during continued processing to further build elements of the electronic device at the first side of the substrate. Also the temporary cover layer protects substrate holders of processing tools against damage induced through the vertical interconnect hole during aggressive processing.

The strength of the cover layer to resist damage is not only influenced by the properties of the layer itself as will be known to those skilled in the art, but also by the dimension of the trench it covers after the temporary filling of the trenches has been removed. By keeping the cross sectional dimension or lateral dimension of the trench opening which has to be spanned by the covering part of the cover layer small, the resilience of the layer against breaking is increased.

In an embodiment the step of providing the substrate with a trench comprises providing the substrate with a plurality of trenches in such a way that after opening of the hole and removal of the sacrificial buried layer at least two of the plurality of trenches are connected to one single hole.

In a number of instances the vertical interconnect requires low electrical resistance, which is too low to be reached using a configuration where the vertical interconnect comprises one single trench. The number of trenches, and their distribution and dimensions may be advantageously tailored to tune the resistance of the vertical interconnect. In addition, the plurality of trenches in one vertical interconnect allows adequate protection based on the strength improvement as described in the previous embodiment, of the open vertical interconnect hole by the cover layer in case a vertical interconnect with large cross sectional diameter is needed.

In an embodiment the step of providing the substrate with a trench comprises providing the substrate with a plurality of trenches and the step of providing the sacrificial buried layer includes forming the cavities at the bottom of the at least two trenches in such a way that a single large cavity is formed that interconnects the at least two trenches.

By choosing which trenches are provided by a cavity and/or controlling which cavities are etched to grow together forming one single cavity connected to multiple trenches, interconnections between multiple vertical interconnects can be made within the substrate.

The creation of one single cavity beneath a plurality of trenches will give improved protection during etching of the hole as explained in detail in the detailed description of the embodiments of this application.

In an embodiment the electronic device is finished according to standard procedures to form a ready to be used electrical unit. Those skilled in the art will known how to perform steps such as addition of metal interconnect, adding of protective layers, dicing of the substrate into single dies, addition of wiring and packaging such that the electronic device can be readily used by customers as a ready to use electrical unit.

According to a second aspect, the invention provides an electronic device prepared according to any of the methods of the previous claims.

By using the method according to the invention the device can be cheaply provided with vertical interconnects that would otherwise require additional process steps. In addition, the decoupling of the steps for formation of the complementary parts being the trenches and the holes of a vertical interconnect possibly in combination with the application of a temporary cover layer makes that more complicated electronic devices can be made. Moreover these can be made with simpler processing.

BRIEF DESCRIPTION OF THE DRAWINGS

These and other aspects of the electronic device, the assembly and the method of the invention will be further elucidated with reference to the figures, in which.

DETAILED DESCRIPTION OF EMBODIMENTS

The Figures are not drawn to scale and purely diagrammatical. Identical reference numbers in different figures refer to identical parts.

Figure 1A:
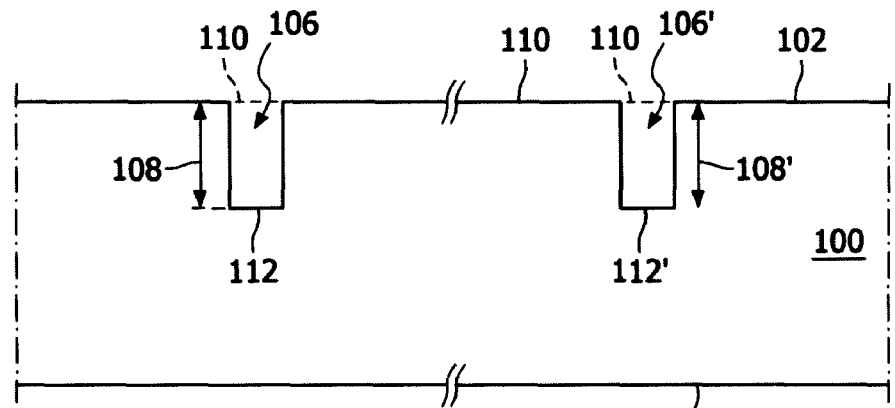
FIGS. 1A and 1B show two stages for manufacturing a vertical interconnect according to the prior art.

FIG. 1 represents two stages of a prior art method for preparing a vertical interconnect in a substrate 100 having a first side 102 and a second side 104. In a first stage of the method trenches 106 and 106' are provided at different positions in the substrate 100 by removing material from the first side 102. The trenches have well controlled substantially identical depths 108 and 108', as measured from the first surface 110 to the bottom of the trenches 112 and 112'.

Figure 1B:
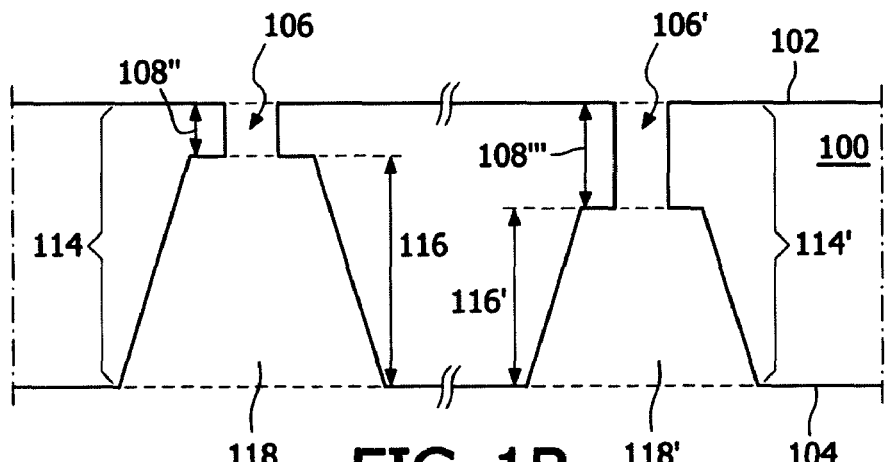

In a next step of the prior art method the vertical interconnect holes 114 and 114' are opened by removing material from the second side 104 to form holes 116 and 116' as shown in FIG. 1B. It may be difficult to precisely control the etch depths 116 and 116' of the holes 118 and 118'. This is especially so when the vertical interconnects are situated on completely different positions within the substrate and/or when crude, but fast and cheap etching procedures are used to form these holes 118 and 118'. Thus, the trench depth 108 and 108' is dependent not only on the process used for providing the trenches 106 and 106', but also on the processes used for providing the holes 118 and 118'. The resulting trench depths 108''' and 108'''' in FIG. 1B indicate that a poor control over the depths 116 and 116' affects the uniformity of the depth of the trenches 106 and 106'. While for some applications this may be tolerated, others require uniformity of electrical properties of vertical interconnects which vertical interconnects will be made in the trenches and the holes. Therefore, one of the dimensions of the trench being the trench depth must be uniform as this one for example largely determines the resistance of the vertical interconnect hole when filled with conducting material such as metal to form the actual vertical interconnect.

Figure 2A:
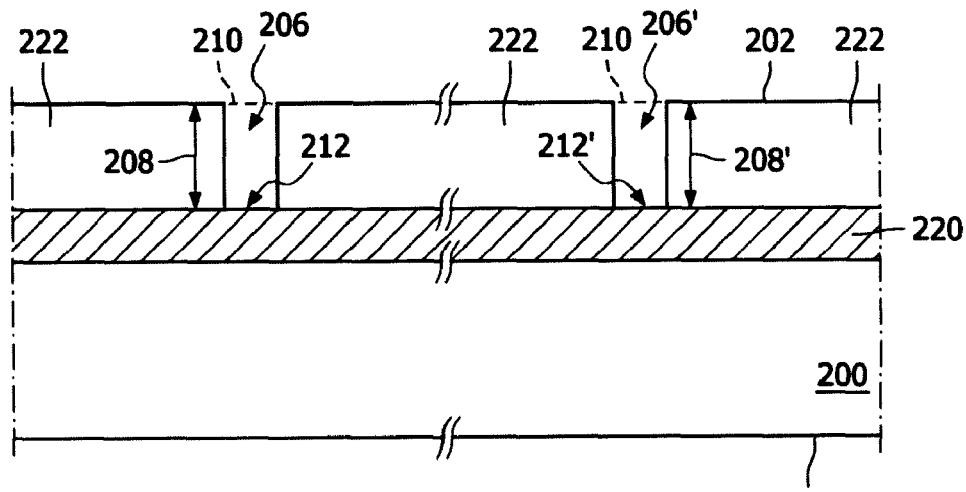
FIGS. 2A to 2C show different stages for making a vertical interconnect according to the invention.
Figure 2B:
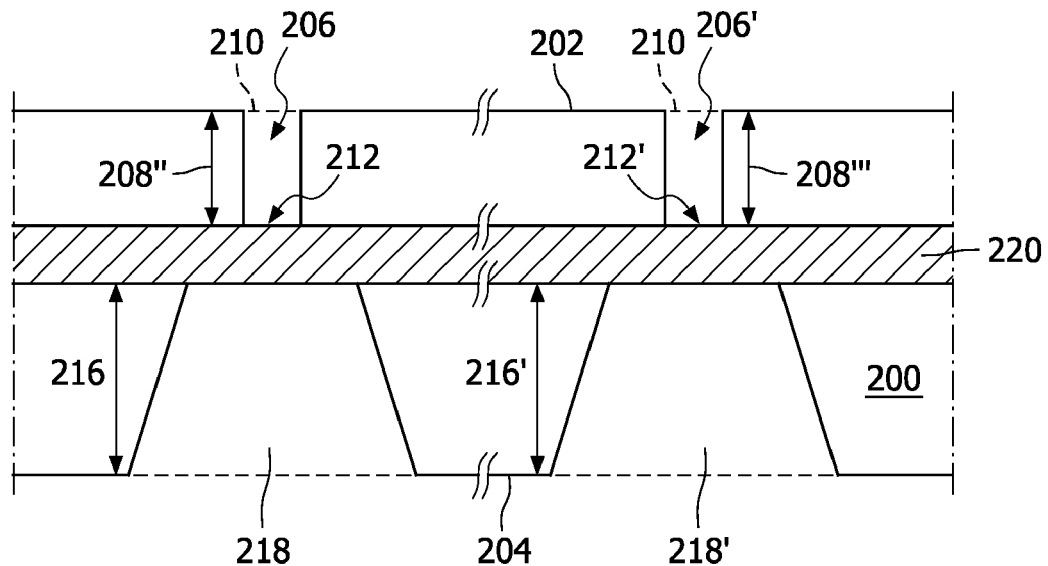
Figure 2C:
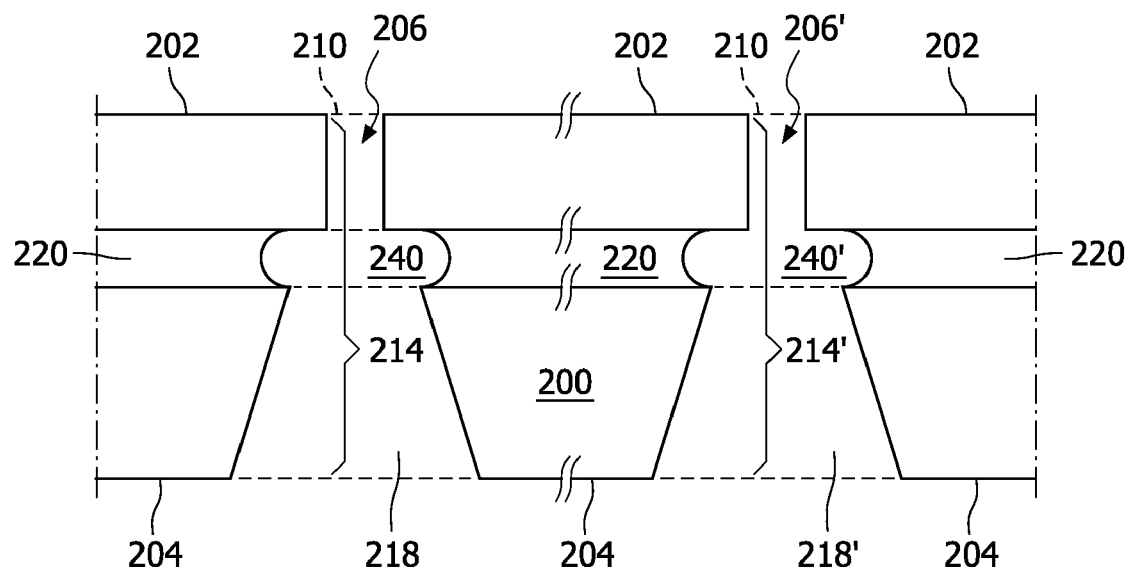

In a first embodiment of the method according to the invention, as shown in FIGS. 2A to 2C, the substrate 200 comprises a buried sacrificial layer 220. As shown in FIG. 2A, first trenches 206 and 206' are formed by removing material from the first side 202 using an etching process during which the sacrificial buried layer 220 is used as an etch stop layer. Thus the material is removed or etched selectively with respect to the material of the sacrificial buried layer. As a result the depth of the trenches is determined by the distance from the sacrificial buried layer 220 to the first surface 210.

In a next stage of the method holes 218 and 218' are provided by removing substrate material from the second side 204 using etching process during which the sacrificial buried layer 220 is again used as an etch stop layer. The result is shown in FIG. 2B.

In a follow up stage, the sacrificial buried layer may be removed partly and selectively against other substrate materials to open the vertical interconnect hole 214 and 214'. The vertical interconnect hole therewith comprises the trench 206 (206'), the cavity 240 (240') and the hole 218 (218'). It will be understood that the vertical interconnect will be formed in this vertical interconnect hole by providing the proper materials to the hole in a proper configuration. Thus, the hole may be filled entirely or, the walls of the vertical interconnect hole may be covered appropriately as for example is done in WO 2005/099699 A1.

As a consequence of the method according to the invention the trench depth is independent of the formation or etching of the hole 218 and 218' and independent of the removal of the sacrificial buried layer 220. The process for formation of the holes 118 and 118' as well as that for removal of the sacrificial buried layer are rendered uncritical with respect to over etching.

In a next stage of the method not shown, the electronic device is further built by providing the substrate with all sorts of electrical elements as well as interconnect structures and/or wiring according to methods known in the art. The opened vertical interconnect hole comprising the trench, the hole and (partly) removed buried sacrificial layer are filled or partly filled with conductive materials to form the vertical interconnect. Materials may comprises metals such as copper or others known in the art of which the conductivity may be tuned to obtain the required resistance within the vertical interconnects.

All sorts of layers with specific functions such as metal diffusion stop layers may be incorporated as known to those skilled in the art. Also an electrically insulating layer may be present on the side-walls of the vertical interconnect hole to limit parasitic interaction between substrate and vertical interconnect. The device may be packaged according to known methods or integrated in a system in a package as described in for example WO 2005/099699. An example is described with respect to FIG. 7 of this application.

In the previously described embodiment the substrate is a semiconductor substrate. For example, the substrate 200 is a silicon on insulator substrate where the insulator is the sacrificial buried layer 220 and the layer 222 is the silicon. Such substrates can be prepared according to known methods and those skilled in the art will known how to control the depth of the trench by controlling the thickness of the silicon layer 222 using silicon growth procedures and/or etching and polishing methods. Those skilled in the art will appreciate that the substrate may comprise materials different from those described in the embodiment. Any combination of materials can be used. Preferably however, the sacrificial buried layer and the materials that need to be removed to form trench and/or hole can be removed selectively with respect to each other.

Figures 3A, 3B:
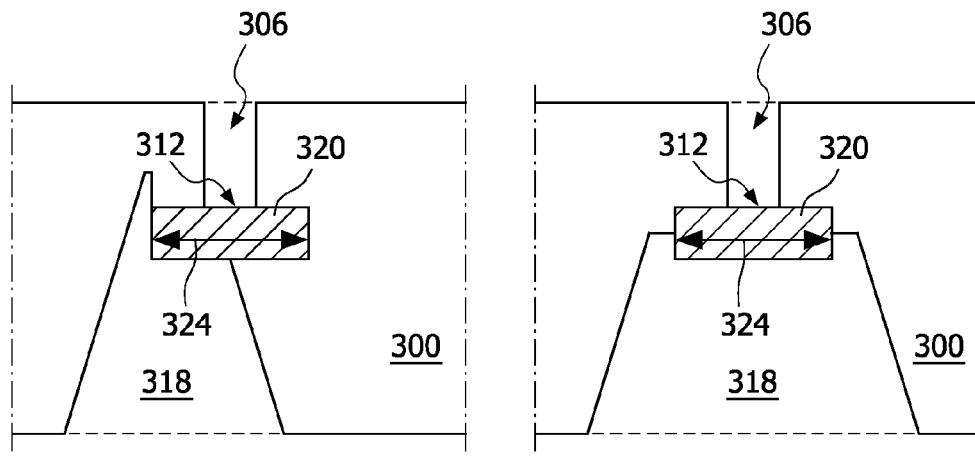
FIGS. 3A and 3B show cross-sectional views of the protective function of the buried sacrificial layer during overetch of the hole.

In the previously described embodiment, the sacrificial buried layer is present in the entire substrate. This need not always be the case as the layer may be patterned. However, in that case it is essential that patterning is such that at those positions required to have a vertical interconnect, the lateral dimensions of the sacrificial buried layer is larger than those of the trench to be etched. In different wordings, creation of the hole, the trench is shielded, protected or screened from the hole by the sacrificial buried layer. The advantages associated with this latter dimensional requirement are elucidated with the aid of FIGS. 3A and B.

As shown in these Figs, the substrates 300 have trenches 306 and patterned or locally present buried sacrificial layers 320 of which the lateral dimensions 224 are larger than the lateral dimension 326 of the area of the buried sacrificial layer exposed by the trench bottoms 312. As a consequence, despite the fact that the hole 318 is displaced asymmetrically with respect to the trenches 306 as in FIG. 3A, or is being etched larger than the lateral dimension of the buried sacrificial layer as in FIG. 3B the trench and therewith its depth is not affected during over etching of the holes 318. Hence, not only the process for providing the hole, but also alignment of the positioning of the hole 318 with respect to the trench 306 is uncritical.

In the embodiments describe here above, the substrate needs to have a buried sacrificial layer from the start whether this layer is patterned or not. In the following second embodiment this is not required. Hence the method according to the second embodiment is advantageously suitable to exploit the advantages of the invention when having to provide vertical interconnects in substrates of which the bulk is made of one and the same material composition and does not yet have a sacrificial buried layer. Exemplifying substrates are well known silicon semiconductor wafers.

Figure 4A:
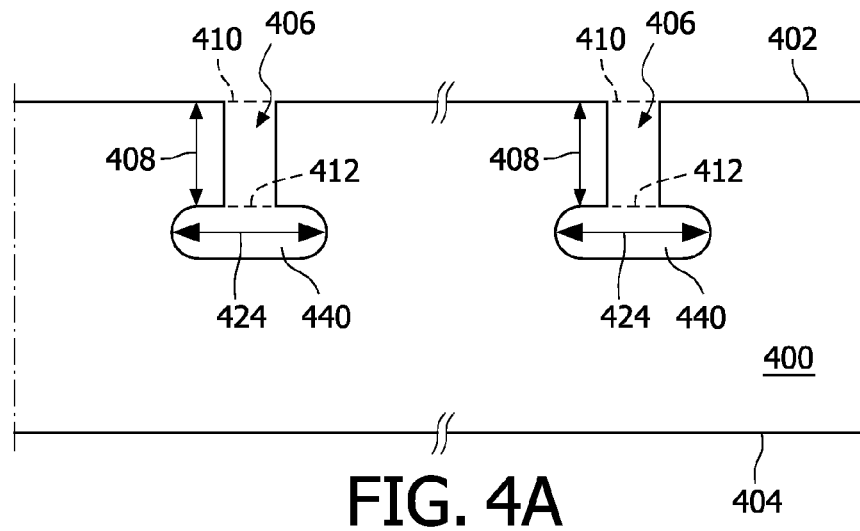
FIGS. 4A, 4B and 5A to 5C show different stages in the manufacture of vertical interconnects according to the invention.
Figure 4B:
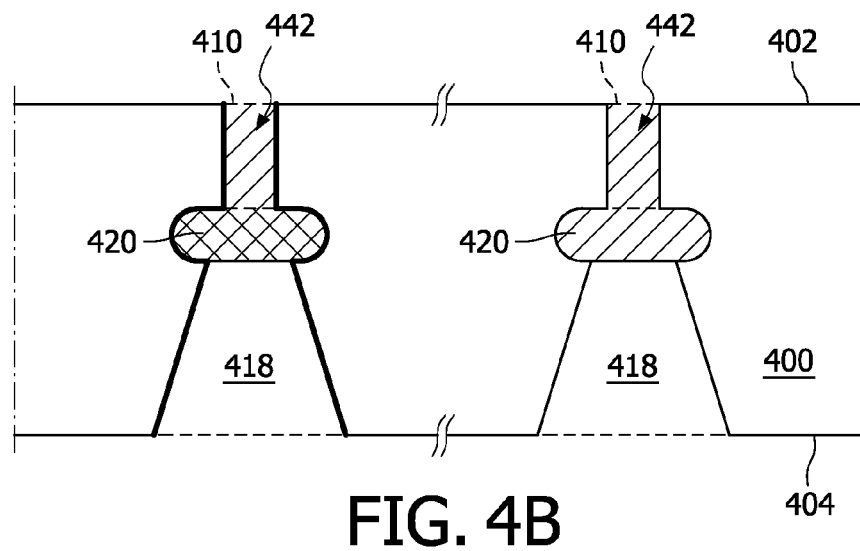

With reference to FIG. 4A, in a first stage a silicon substrate 400 having a first side 402 and a second side 404 is provided with trenches 406 by removing material from the first side using an etching process. The trenches 406 are etched to depths 408 measured from the first surface 410 to the bottoms of the trenches 412. Preferably, etching is done using an anisotropic etching process such as a directional dry etch process as known in the art. In a next step, cavities 440 are a provided using an isotropic etching procedure. Preferably, the etching is a non-directional dry etching technique which allows that cavity etching can be performed in the same etching tool as the one used for trench etching therewith saving production time and cost. Alternatively, wet etch can be using for example KOH solution can be employed. In that case it may be necessary to deposit a liner layer in the trench that protects the trench wall from etching by etching fluid since this fluid needs to be provided to the cavity through the trench. The liner layer may be prepared using spacer formation techniques known in the art. Furthermore, in order to overcome any possible problems during provision of the etching fluid to the cavity through the small trench openings stemming from capillary forces, surfactants can be employed.

In a next step the cavities and optionally also the trenches are filled with a material that can be selectively removed against any other substrate materials to form the sacrificial buried layer 420 and the temporary filling 442. The cavity does not need to be filled entirely, but only to such an extent that the sacrificial buried layer resulting from it behaves like described here before with respect to FIGS. 3A and 3B. The filling may be accomplished for example by thermal oxidation of the material wherein the cavity is formed or CVD deposition of silicon oxide or silicon nitride as known in the art. In one variation not only the cavity, but also the trench may be filled entirely. Optionally the excess material of the temporary filling of the trenches may be removed from the first side 402 of the substrate in order to create a first surface 410 that is level with the entire substrate surface using a backetch or polishing step as known in the art.

Next, the holes 418 are etched as described for the first embodiment. The cavities are provided in such a way that the lateral dimensions 424 of the cavities and the sacrificial buried layers are larger than the bottom areas 412 of the trenches 406. Therewith etching and positioning of the holes 418 is relatively uncritical in the same way as described for the first embodiment. In a following step the cavities and the trenches are opened to create the vertical interconnect hole which is filled with material of appropriate conductivity to result in a vertical interconnect.

According to the method of the invention as exemplified by the embodiments described here before, a vertical interconnect can be made in a two-step etching process in which the etch steps are decoupled. The feature sizes of each of these etching steps may be chosen according to need. Thus, while the trench may be formed using an etching process that can be well-controlled and produces features with relatively small size, the hole forming the complimentary part of the vertical interconnect, can be formed using a cruder, faster, less well-controlled etching process, which may result in the hole to have a larger dimension than the trench.

Figure 5A:
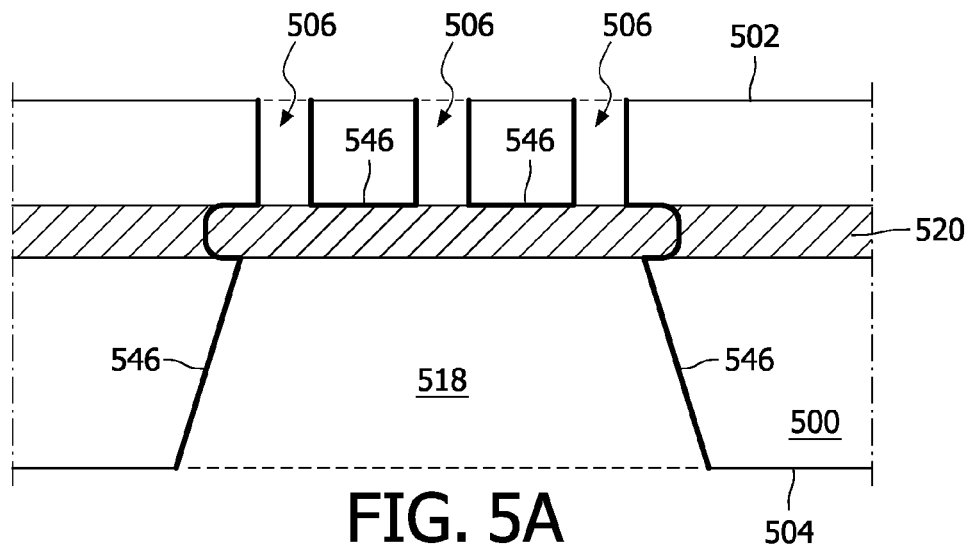
Figure 5B:
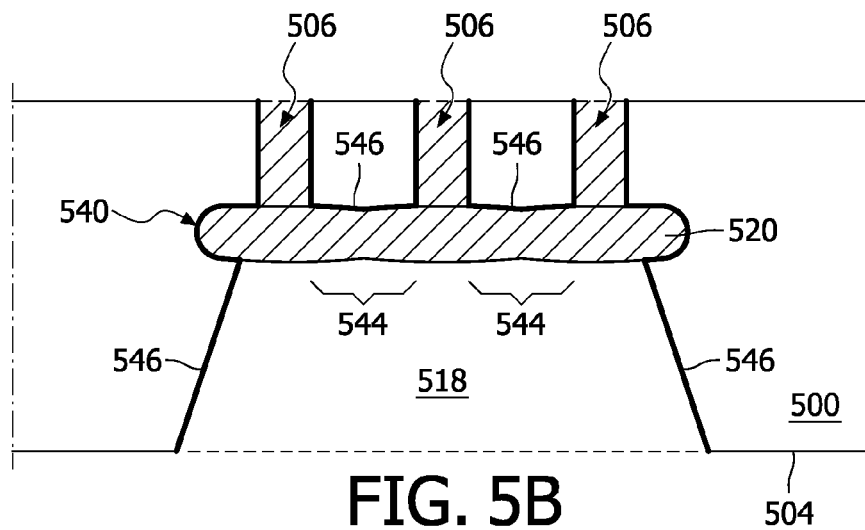
Figure 5C:
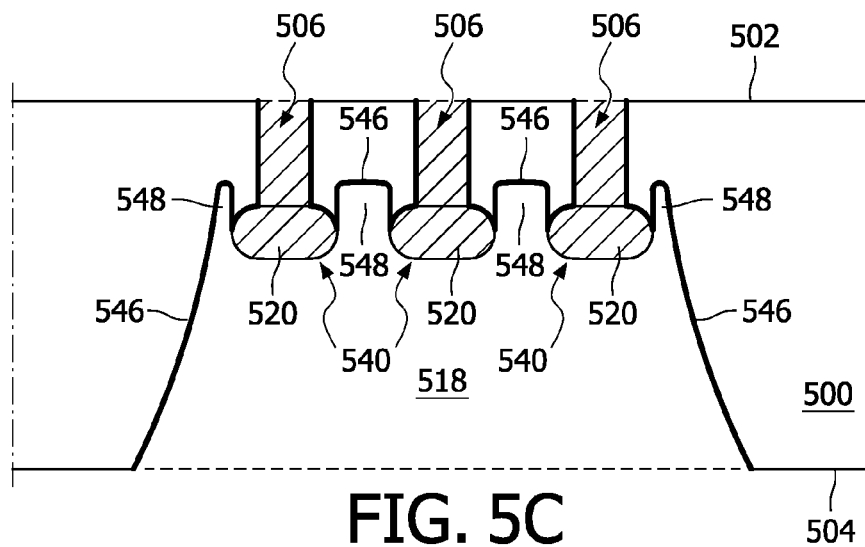

In some electronic devices low resistance vertical interconnects are desired requiring quite large cross sectional dimensions in comparison to features of other electrical elements. At the same time the trenches of these vertical interconnects are required to be etched with small dimensions. In that case a grid of closely spaced trenches may be formed that will be connected to one single hole with a large dimension. A number of embodiments fulfilling these requirements are shown in FIGS. 5A to 5C in which the final vertical interconnect hole contours are represented by the thick lines 546. Such vertical interconnect holes can be formed as follows.

A substrate 500 is provided with trenches 506 etched from the first side 502 and a hole 518 etched from the second side 504 of the substrate. In FIG. 5A the substrate comprises a buried sacrificial layer 520 ready to be used as an etch stop layer during formation of the trenches and the holes. However, different substrates do not have such a sacrificial layer present. In that case filled cavities 540 are made that function as the sacrificial buried layer 520 as described in the second embodiment before etching of the holes 518 as shown in FIGS. 5B and 5C. In FIG. 5B the cavities of neighboring trenches have been formed such that they have grown together in regions 544 to form one large cavity. Especially when spacing between neighboring trenches is small such growing together of individual cavities will be easily obtained using short cavity etching time. However, when spacing between neighboring trenches of a vertical interconnect is, larger as in FIG. 5C, etching to form a single large cavity connecting all trenches may take a long time which is expensive. In such a case it is advantageous to use the alternative method in which the individual cavities 540 beneath every trench 506 is formed according to the invention, but is not etched to be connected to its neighbor as shown in FIG. 5C. As explained earlier this approach suffices to protect the dimensions of the trenches during formation of the whole 518. Over-etching as represented in the regions 548 shown in FIG. 5C is tolerated without loss of the advantageous effect of the invention.

A fourth embodiment provides an example of how the invention can be used to advantage when processing on both sides of the substrate is desired (with which electrical devices other than vertical interconnects are made) while one side is protected against processing on the other in a convenient way. The method provides protection of the substrate holder when the vertical interconnect hole is completely opened. Complete opening in an early stage of a semiconductor manufacturing method is often required since etching tools used to remove the material during opening often do not tolerate the presence of contaminating materials provided to the substrate in a later stage of the process. Metals amongst others used for filling the vertical interconnect hole are a particularly contaminating group of materials in that sense.

Figure 6A:
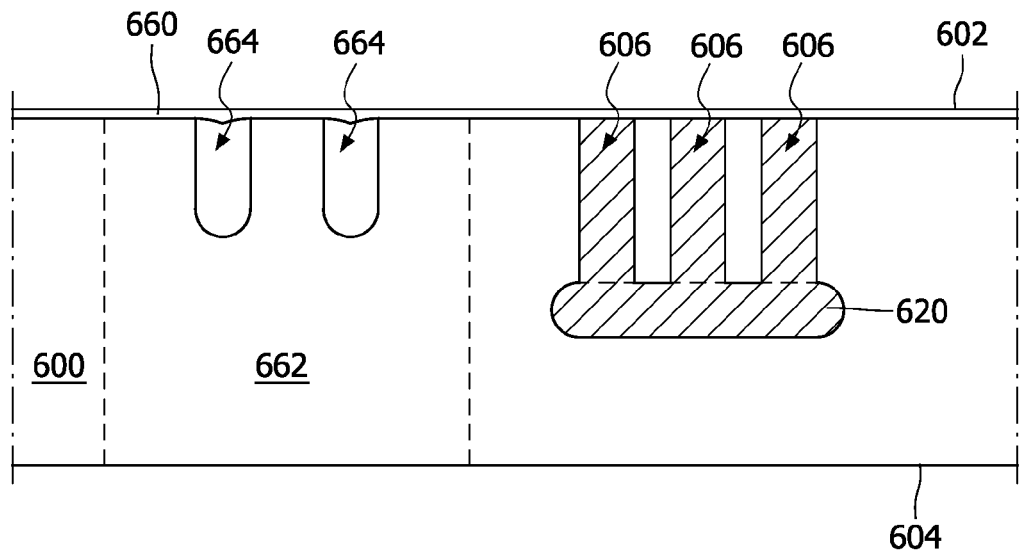
FIGS. 6A to 6D show different stages of the method for making a vertical interconnect and an electronic device according to the invention.

In the fourth embodiment, as shown in FIGS. 6A to 6D, a high-ohmic silicon substrate is provided with a trench 606 comprising a temporary filling and a sacrificial buried layer 620. The temporary filling and the sacrificial buried layer are for example made from silicon oxide deposited suing for example a conformal deposition technique such as (low pressure) chemical vapor deposition. This may be achieved through for example utilizing a part of the previously described method of the second embodiment. Note however that the same result may be obtained using a substrate that has a sacrificial buried layer from the start as in the previously described first embodiment. The result is shown in FIG. 6A.

By way of example it is shown how a trench capacitor is made in combination with a vertical interconnect according to the invention. The trench capacitor serves as the additional electrical element of the electronic device to be made, in this embodiment the substrate is provided by trench capacitor on the first side of the substrate. The trenches 664 of this future capacitor conveniently have been etched in the same process step as the trenches 606 of the vertical interconnect. This is possible since the dimensions of both types of trenches is in the same order of magnitude. The trenches 664 were masked before etching of the cavity 640 and filling of this cavity 640 and the trenches 606 to result in the stage depicted by FIG. 6A showing filled trenches 606 and a sacrificial buried layer 620.

After provision of the fillings, on top of the first surface at the first side 602 of the substrate 600 a temporary protective layer 660 is provided according to appropriate deposition techniques known in the art. The layer must at least cover the openings of the trenches 606 at the first side 602. In the present embodiment the layer is not patterned at this stage of the process. Preferably the layer 660 comprises a material that can be removed selectively against the temporary filling of the trench 606. In this embodiment it is made of LPCVD silicon nitride.

Subsequently, the hole 618 is etched from the second side using etching which can be dry etching or wet etching according to need following procedures known in the art as long as the etching is selective against the sacrificial buried layer 620. If dry etching such as plasma etching is used, the substrate is turned over to be attached to the etch-tool chuck with the first side. A flat layer is advantageous in this respect since attachment to the chuck is often done using vacuum.

Following etching of the hole 618 the sacrificial buried layer 620 and the trench filling is removed in the same way as the hole 618 was etched with this difference that the removal must now be selective against the substrate material surrounding the cavity and trench and the layer 660. Hereafter the layer 660 is patterned to result in the stage depicted in FIG. 6B. Alternatively it was patterned right after its deposition.

An optional substrate thinning step from the second side may be performed before etching the hole 618. The thinning step may be performed for instance by grinding or (chemo-mechanical) polishing and/or by etching. Alternative methods for the hole opening or thinning include powder blasting if dimensions of the hole are relatively large.

Each of the trenches 606 of the grid of trenches of a vertical interconnect hole, has a small diameter which provides that the thin layer 660 does not have to span a large interconnect hole. Hence advantageously, the protection offered by the layer 660 is still strong when the filling of the trenches has been removed. Therewith aggressive processing steps such as metal physical vapor deposition (PVD) may be carried out at the first side while the vertical interconnect holes are completely opened.

Figure 6B:
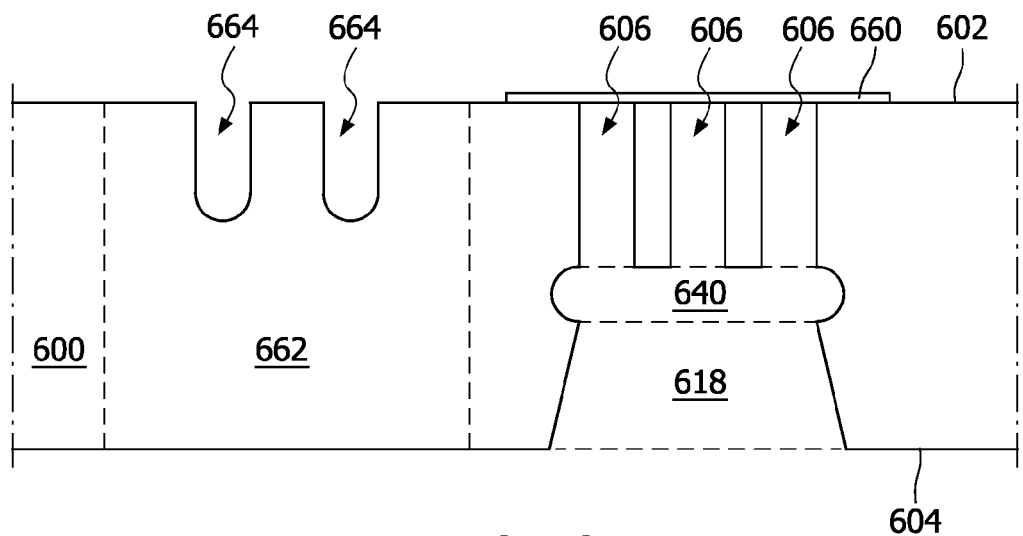

At the stage of the method depicted in FIG. 6B, the substrate with all its additions and vertical interconnect holes may be subjected to continued processing to prepare electrical elements on the first side 602 within region 662 for example. Such processing may include the aforementioned aggressive processing such as PVD as well as processing that results in deposition of contaminating materials, since all etching steps have been performed and the layer 660 protects the chucks of processing tools from becoming contaminated or damaged via the vertical interconnect hole. Furthermore, no open vertical interconnect holes are present that obstruct the holding of substrates on tool chucks or other substrate holders that rely on vacuum for this purpose.

Figure 6C:
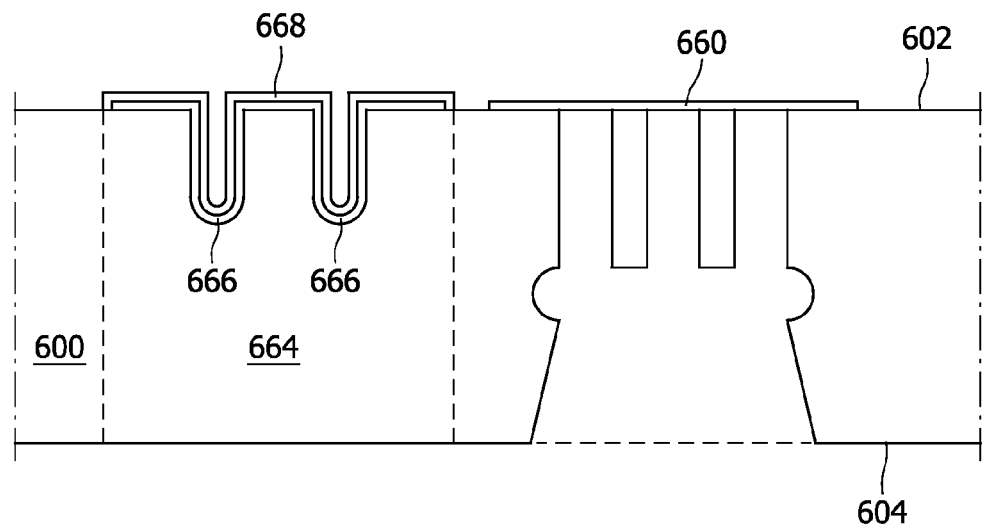
Figure 6D:
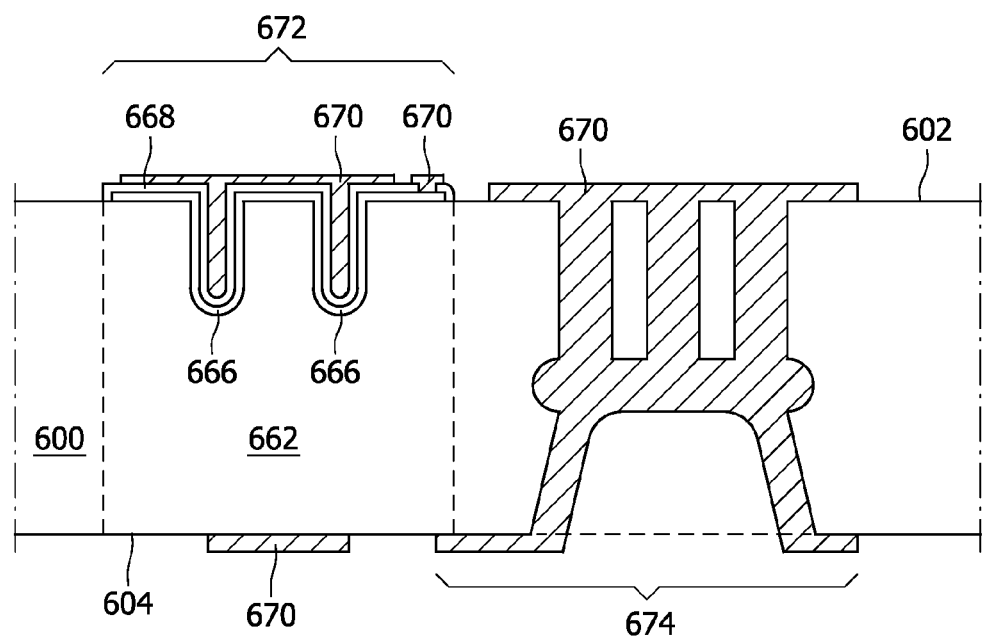

Thus as an example and with reference to FIG. 6C, the metal layer 666 is PVD deposited on the first side 602 in region 662 and patterned to form a bottom electrode of a capacitor having trenches 664. Next an insulating layer 668 is provided and patterned using methods known in the art. The layer may for example be a silicon oxide-silicon nitride-silicon oxide (ONO) layer. Next the layer 660 is removed and metal layer 670 is deposited to fill the vertical interconnect hole and cover the first and second side of the substrate. This may be done in a two step deposition process each step covering one side of the substrate. Then the metal layers are patterned on either side of the substrate to obtain the desired wiring pattern. The insulating layer may be provided such that it also covers the inside of the vertical interconnect hole. In that way it may provide electrical insulation of the vertical interconnect from the substrate and/or it may provide a barrier for diffusion of vertical interconnect material into the substrate.

The result shown comprises a capacitor 672 and a vertical interconnect 674 connected via wiring on the first side.

Those skilled in the art will know how to use the present invention in an advantageous way for making other electronic devices.

It will be evident that the lateral dimensions and shape of a trench and hole of any vertical interconnect are defined by mask design and can be chosen according to need taking care that in case a cover layer is used the dimensions allow appropriate strength of the cover layer.

Figure 7:
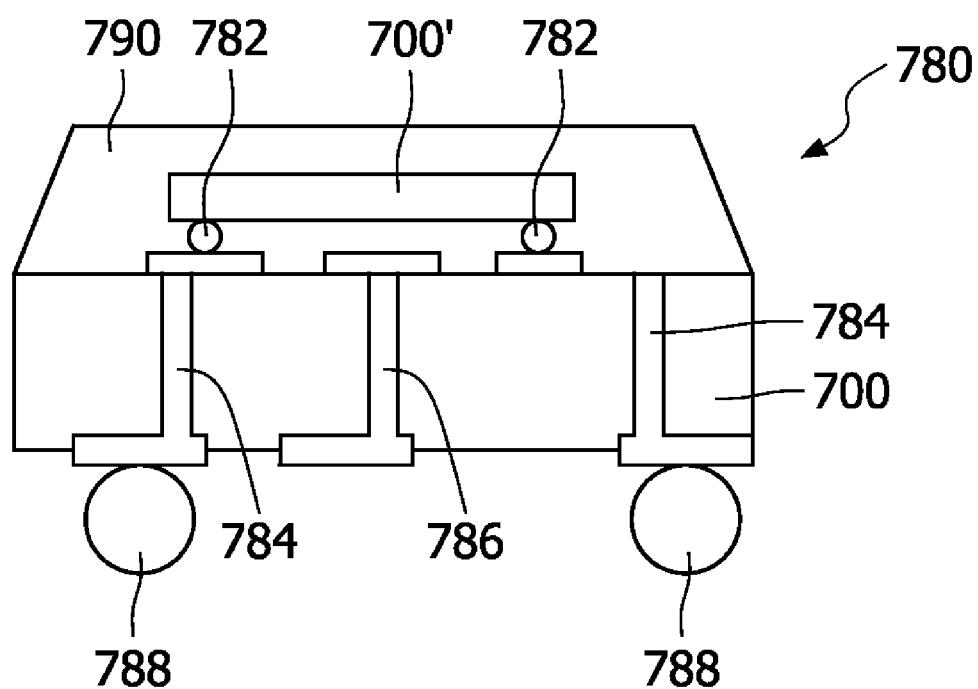
FIG. 7 shows a ready to be used electrical unit according to the invention

An embodiment as shown in FIG. 7 provides an example of how the vertical interconnects can be used to advantage in ready to be used electronic unit 780. The unit comprises one or more electronic devices according to the invention assembled together in a package or system in a package. In this embodiment one of the electronic devices is the electronic device 700 which serves as a passive (rerouting) connectivity integrated circuit. The other electronic device 700' in this case is an active integrated circuit such as a CMOS, BIPOLAR or other integrated circuit capable of performing (complicated) electronic functions.

The assembly makes use of a construction, in which the electronic device 700' is electrically connected to bond pads on the first side of the electronic device 700 via solder balls 782. The bond pads are interconnected to vertical interconnects 784 according to the invention, which transfer the electrical signals to the second side of the electronic device 700. Other vertical interconnects according to the invention 786 are used to transfer further electrical signals from one side to another side of the electronic device 700. The vertical capacitors as for example present in the device of FIG. 6D or any other electrical elements are not shown in the device 700. It will however be appreciated that these and other electronic elements may be present in all of the electronic circuits present in the devices of the package according to need. The package is provided with an overmould 790 to provide integrity of the assembly and protect the various electronic devices inside. The solder balls or bumps 788 serve to connect the package or assembly to an appropriate underground which uses the electrical function of the package.

In such package as well as other electronic devices, the vertical interconnect may not only provide electrical connectivity, but also thermal control. For example the vertical interconnects 784 may serve as a heat sink for heat generated in the active device 700' In that sense the possibility of forming vertical interconnects having buried connections, i.e. inbetween the first and second side of a substrate or an electronic device may be used to advantage for spreading heat.

The ready to be used unit 780 can be assembled or manufactured using standard methods as known in the art. Details can for example be found in WO 2005/099699 A1. In alternative embodiments of ready to be used electrical units more semiconductor and other electronic devices can be provided on one or more of the sides of the electronic device 700. Those skilled in the art will know how to exploit the present invention in favour of designing and manufacturing such units.

The further electronic devices may be devices that cooperate with the semiconductor device to provide a functional subsystem. Examples hereof are ESD/EMI protection devices, band pass filters, such as BAW filters, impedance matching circuits.

Although the invention has been elucidated using semiconductor substrates, the scope of the invention is wider than those substrates. The invention is applicable to all substrates requiring vertical interconnects. Substrates may thus be of glass, aluminumoxide polysilicon etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element or product does not exclude the presence of a plurality of such elements or products. The mere fact that certain measures are recited in mutually different dependent claims does not indicate that the combination of these measures cannot be used to advantage.

The invention claimed is:

1. A method for manufacturing an electronic device comprising a vertical interconnect through a semiconductor substrate having a first surface on a first side and a second surface on a second side, the vertical interconnect extending from the first surface to the second surface, the method comprising the successive steps of:
   providing the substrate with a sacrificial buried layer arranged in between the first and second surface;
   providing the substrate with a trench extending from the first surface to the sacrificial buried layer by removing material from the first side of the substrate, the sacrificial buried layer therewith being exposed over a first area, the sacrificial buried layer having a first cross section taken parallel to the plane of the first area which first cross section is larger than the first area and overlaps with the first area, and
   providing the substrate with a hole extending from the second surface to the sacrificial buried layer by removing material from the second side of the substrate selectively with respect to the sacrificial buried layer, the sacrificial buried layer therewith being exposed over a second area, the sacrificial buried layer having a second cross section taken parallel to the plane of the second area which second cross section is larger than and overlaps with the second area, and the second area being smaller than the first area; and wherein the step of providing the substrate with a sacrificial buried layer comprises the successive steps of:
   providing a substrate without the sacrificial buried layer,
   providing the trench before performing the step for providing the hole, the step of providing the trench including anisotropic removal of material from the first side of the substrate such that the trench is formed having a bottom with a bottom area located within the semiconductor substrate in between the first and second surface, and
   after providing of the trench and before providing the hole, performing the step of providing the sacrificial buried layer such that it is provided in between the first and second surfaces of the semiconductor substrate by forming a cavity at the bottom of the trench, the cavity having a cross section parallel to the plane of the bottom of the trench, which cross section is larger than the area of the bottom of the trench, and filling at least part of the cavity with a sacrificial material.

2. A method according to claim 1 wherein the cavity is provided using an isotropic dry etch technique.

3. A method according to claim 1 wherein the method comprises the further steps of:
   providing the trench with a temporary filling extending up to at least the first surface,
   after providing the temporary filling, continue processing to further build the electronic device,
   after the continued processing removing the sacrificial buried layer and the temporary filling from the second side therewith opening a vertical interconnect hole.

4. A method according to claim 3 wherein the temporary filling of the trench is chosen from a group of materials that does not contaminate semiconductor processing tools.

5. A method according to claim 1 wherein the method comprises the further steps of:
   providing the trench with a temporary filling extending up to at least the first surface,
   providing on the first side of the substrate a temporary cover layer covering at least the temporary filling, after providing the temporary cover layer, removing the sacrificial buried layer and the temporary filling from the second side therewith exposing the temporary cover layer from the second side.

6. A method according to claim 1 wherein the step of providing the substrate with a trench comprises providing the substrate with a plurality of trenches in such a way that after opening of the hole and removal of the sacrificial buried layer at least two of the plurality of trenches are connected to one single hole.

7. A method according to claim 1 wherein the step of providing the substrate with a trench comprises providing the substrate with a plurality of trenches and the step of providing the sacrificial buried layer includes forming the cavities at the bottom of the at least two trenches in such a way that a single large cavity is formed that interconnects the at least two trenches.

8. A method according to claim 1 wherein the electronic device is finished according to standard procedures to form a ready to be used electrical unit.

9. A method for manufacturing an electronic device comprising a vertical interconnect through a semiconductor substrate having a first surface on a first side and a second surface on a second side, the vertical interconnect extending from the first surface to the second surface, the method comprising:
providing the substrate without a sacrificial buried layer arranged in between the first and second surface;
providing the substrate with a trench by anisotropic removal of material from the first side of the substrate such that the trench is formed having a bottom with a bottom area located within the semiconductor substrate in between the first and second surface;
providing a sacrificial buried layer in between the first and second surfaces of the semiconductor substrate by forming a cavity at the bottom of the trench, the cavity having a cross section parallel to the plane of the bottom of the trench, which cross section is larger than the area of the bottom of the trench, and filling at least part of the cavity with a sacrificial material; and
providing the substrate with a hole extending from the second surface to the sacrificial buried layer by removing material from the second side of the substrate selectively with respect to the sacrificial buried layer, the sacrificial buried layer therewith being exposed over an exposed area.

10. A method according to claim 9, wherein the sacrificial buried layer has a cross section taken parallel to the plane of the exposed area which cross section is larger than and overlaps with the exposed area, and the exposed area being smaller than the area of the bottom of the trench.

11. A method according to claim 9 wherein the cavity is provided using an isotropic dry etch technique.

12. A method according to claim 9 wherein the method further comprises:
providing the trench with a temporary filling extending up to at least the first surface,
after providing the temporary filling, continue processing to further build the electronic device,
after the continued processing removing the sacrificial buried layer and the temporary filling from the second side therewith opening a vertical interconnect hole.

13. A method according to claim 12 wherein the temporary filling of the trench is chosen from a group of materials that does not contaminate semiconductor processing tools.

14. A method according to claim 9 wherein the method further comprises:
providing the trench with a temporary filling extending up to at least the first surface,
providing on the first side of the substrate a temporary cover layer covering at least the temporary filling,
after providing the temporary cover layer, removing the sacrificial buried layer and the temporary filling from the second side therewith exposing the temporary cover layer from the second side.

15. A method according to claim 9 wherein the step of providing the substrate with a trench comprises providing the substrate with a plurality of trenches in such a way that after opening of the hole and removal of the sacrificial buried layer at least two of the plurality of trenches are connected to one single hole.

16. A method according to claim 9 wherein the step of providing the substrate with a trench comprises providing the substrate with a plurality of trenches and the step of providing the sacrificial buried layer includes forming cavities at the bottom of at least two of the trenches in such a way that a single large cavity is formed by the cavities that interconnects the at least two trenches.

17. A method according to claim 9 wherein the electronic device is finished according to standard procedures to form a ready to be used electrical unit.

\* \* \* \* \*